(12) United States Patent
Weber et al.

(10) Patent No.: US 7,208,968 B2
(45) Date of Patent: Apr. 24, 2007

(54) TEST SYSTEM FOR TESTING INTEGRATED CHIPS AND AN ADAPTER ELEMENT FOR A TEST SYSTEM

(75) Inventors: Frank Weber, Kraiburg am Inn (DE); Gerd Frankowsky, Höhenkirchen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/865,050

(22) Filed: Jun. 10, 2004

(65) Prior Publication Data
US 2005/0017748 A1      Jan. 27, 2005

(30) Foreign Application Priority Data
Jun. 11, 2003    (DE) ............................. 103 26 317

(51) Int. Cl.
*G01R 31/26* (2006.01)
(52) U.S. Cl. ..................................... 324/765
(58) Field of Classification Search ............... 324/765, 324/763, 754, 761–762, 755, 158.1; 439/130–131, 439/59, 119, 146
See application file for complete search history.

(56) References Cited

U.S. PATENT DOCUMENTS

| | | | | |
|---|---|---|---|---|
| 4,145,620 A | * | 3/1979 | Dice | ............................ 307/149 |
| 5,003,156 A | | 3/1991 | Kilpatrick et al. | |
| 5,966,021 A | * | 10/1999 | Eliashberg et al. | .......... 324/760 |
| 6,363,510 B1 | * | 3/2002 | Rhodes et al. | ............... 714/738 |
| 6,400,173 B1 | * | 6/2002 | Shimizu et al. | .............. 324/765 |
| 6,771,088 B2 | * | 8/2004 | Kim et al. | .................... 324/765 |
| 6,822,469 B1 | * | 11/2004 | Kline | ........................... 324/765 |
| 6,910,162 B2 | * | 6/2005 | Co et al. | ..................... 714/718 |
| 2001/0011906 A1 | | 8/2001 | Nakata et al. | |

OTHER PUBLICATIONS

Examination Report dated Feb. 10, 2004.

* cited by examiner

*Primary Examiner*—Ha Tran Nguyen
*Assistant Examiner*—Tung X. Nguyen
(74) *Attorney, Agent, or Firm*—Patterson & Sheridan, L.L.P.

(57) ABSTRACT

Test system for testing integrated chips and an adapter element for a test system. One embodiment provides a test system for testing integrated chips in a burn-in test operation, the integrated chips to be tested being arranged in groups on a burn-in board, the burn-in board having a first connecting device in order to connect the burn-in board to a tester device, the tester device comprising a test module with a test circuit in order to test chips on the burn-in board in accordance with the burn-in test operation, the test module having a second connecting device in order to connect the burn-in board to the test module via the second connecting device, a plurality of test modules being provided, the second connecting devices of which can be contact-connected to a plurality of third connecting devices of an adapter element, the adapter element having a fourth connecting device for contact-connection of the first connecting device of the burn-in board, the third connecting devices of the adapter element being connected to the fourth connecting device in such a way that, in the contact-connected state, it is possible to test each integrated circuit of a group with one of the test modules.

21 Claims, 1 Drawing Sheet

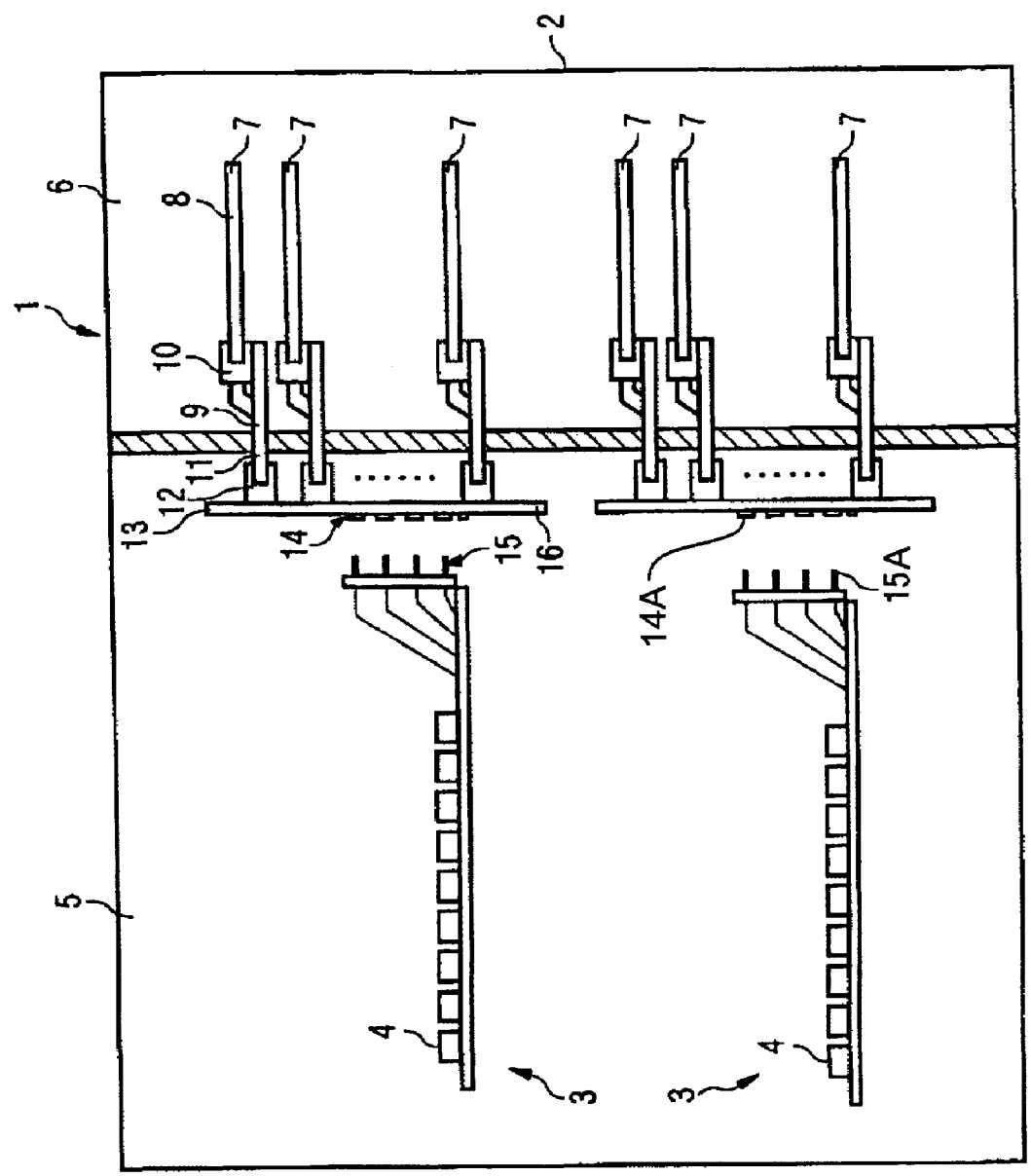
Figure

TEST SYSTEM FOR TESTING INTEGRATED CHIPS AND AN ADAPTER ELEMENT FOR A TEST SYSTEM

CROSS-REFERENCE TO RELATED APPLICATIONS

This application claims foreign priority benefits under 35 U.S.C. §119 to co-pending German patent application number 103 26 317.9-35, filed Jun. 11, 2003. This related patent application is herein incorporated by reference in its entirety.

BACKGROUND OF THE INVENTION

1. Field of the Invention

The invention relates to a test system for testing integrated chips in a burn-in test operation and also to an adapter element for such a test system.

2. Description of the Related Art

In a test system for a burn-in test operation, the integrated chips to be tested are usually arranged on a burn-in board, i.e., on a burn-in board having receptacles for the integrated chips, and are inserted into a tester device of the test system. The tester device has test modules with driving and evaluation electronics, i.e., with test circuits. When the burn-in board is inserted, a test module of the tester device is connected to the integrated chips on the burn-in board. During the burn-in test operation, the function of the integrated chip is tested under extreme operating conditions, such as elevated ambient temperature, high operating voltage or the like, in order to pre-age the chip and thus to reduce the early failure rate.

Due to the increasing packing density of the burn-in receptacles on the burn-in board, the maximum current limiting of the test module and/or the number of available test channels are often reached or exceeded. This problem arises, inter alia, also during a wafer level burn-in test operation during which the integrated circuits on a wafer are intended to be tested, and thereby pre-aged, simultaneously in one burn-in test operation prior to being separated into individual chips. Successively effected burn-in test operations with the integrated circuits situated on a common wafer cannot be carried out, since the burn-in time would be considerably lengthened and the integrated circuits would experience different pre-ageing conditions.

In order not to exceed the maximum current limiting of the test module or the number of available tester channels, either the packing density of the receptacles on the burn-in boards is reduced or the burn-in boards are only partially populated with integrated chips to be tested. As an alternative, either additional current sources or new test modules have been provided, in order to meet the altered conditions. This has the disadvantage that the burn-in boards are utilized non-optimally, or it has been necessary to accept high costs on account of new test modules and/or additional supply sources.

SUMMARY OF THE INVENTION

It is an object of the present invention to provide a test system in which the burn-in board can be fully utilized, without the need for converting the tester device to suitable new test modules for controlling the burn-in test operation.

A first aspect of the present invention provides a test system for testing integrated chips in a burn-in test operation. The integrated chips to be tested can be arranged in groups on a burn-in board. The burn-in board has a first connecting device to connect the burn-in board to a tester device. The tester device comprises a test module with a test circuit to test chips on the burn-in board in accordance with the burn-in test operation. The test module has a second connecting device to connect the burn-in board to the test module via the second connecting device. In the tester device, a plurality of test modules are provided, and the second connecting devices which can be contact-connected to a plurality of third connecting devices of an adapter element. The adapter element has a fourth connecting device for contact-connection of the first connecting device of the burn-in board, the third connecting devices of the adapter element being connected to the fourth connecting device in such a way that, in the contact-connected state, each group of integrated circuits may be tested by means of one of the test modules.

One embodiment provides a test system in which a plurality of test circuits of the test modules can be connected to the integrated chips of a tester palette, such that the integrated chips of a tester palette can be tested by a plurality of test modules. Consequently, the number of integrated chips of a tester palette which are tested by a test module may be reduced. Connecting a plurality of test modules to the integrated chips, on the burn-in board assigned to the test modules via the adapter element, makes it possible to assign supply currents that are virtually as high as desired and a virtually arbitrary number of tester channels to the integrated chips to be tested. This furthermore avoids the need to construct new test modules adapted to the required supply currents and the required tester channels in order to test a tester palette that is fully populated with integrated chips in one burn-in test operation.

It may furthermore be provided that the tester device has a heating chamber in which the burn-in boards can be arranged. The test circuit of the test module is isolated from the heating chamber, and the second connecting device of the test modules extends into the heating chamber in order to be connected to the third connecting devices of the adapter element. In this way, the adapter element can be connected to the second connecting devices in a simple manner without the tester device having to be reconfigured in a complicated manner.

The first connecting device of the burn-in board may include one or more pogo pins which ensure a suitable electrical connection between the burn-in board and the adapter element.

The second connecting devices of the test modules may be formed as contact strips and/or as connector strips which may be arranged in one plane with the test modules.

A further aspect of the present invention provides an adapter element for such a test system. The adapter element makes it possible to leave already available tester devices unchanged and, with the aid of the adapter element, to bundle a plurality of test modules of the tester device such that a burn-in board which is inserted into the tester device is connected to the plurality of test modules. Thus, a higher supply current may be supplied to the integrated chips on the burn-in board, and a larger number of tester channels are made available for testing the integrated circuits arranged on the burn-in board.

The adapter element may include a holding element, on which the third connecting devices are arranged in such a way as to be plugged onto the second connecting devices of the plurality of test modules, so that the test modules are arranged essentially perpendicular to the holding element.

A further aspect of the present invention provides a burn-in board for such a test system, which is configured in such a way as to be connected to the adapter element according to embodiments of the invention.

BRIEF DESCRIPTION OF THE DRAWINGS

A preferred embodiment of the invention is explained in more detail below with reference to the accompanying drawing.

The FIGURE is a schematic diagram illustrating a test system according to one embodiment of the invention.

DETAILED DESCRIPTION OF THE PREFERRED EMBODIMENT

The FIGURE shows a test system 1 according to one embodiment of the invention with a tester device 2, into which one or a plurality of burn-in boards 3 can be inserted. The burn-in boards 3 have chip receptacles 4 into which integrated chips can be inserted for testing in a burn-in test operation.

The burn-in test operation of integrated chips usually takes place under extreme operating conditions after their completion. Thus, during the burn-in test operation, the integrated chips are usually operated at an elevated ambient temperature, usually more than 100° C., and with an elevated supply voltage in order to reduce the so-called early failure rate of the integrated chips.

To provide the elevated ambient temperature for the integrated chips to be tested, the tester device 2 is provided with a heating chamber 5, in which the burn-in boards 3 are situated in the inserted state. Outside the heating chamber 5, in a test module region 6 of the tester device 2, test modules 7 with test circuits 8 are provided and may be constructed generally identically to carry out the same test program in each case for testing the integrated chips. Furthermore, a supply voltage for the burn-in boards 3 is made available by the test modules 7.

To electrically connect the test circuits 8 of the test modules 7 to the integrated chips on the burn-in boards 3 in the heating chamber 5, the test modules 7 each have a connection device 9, which can be connected to the respective test circuit 8 via a contact-connecting device 10. At an end facing the heating chamber 5, the connection device 9 of the test module 7 has a second contact unit 11, which can interact with a third contact unit 12 of an adapter element 13 in order to realize electrical connections.

The adapter element 13 further includes a fourth contact unit 14 for producing electrical connections to a first contact unit 15 of one of the burn-in boards 3. The chip receptacles 4 or the integrated chips that can be connected thereto, which may be tested in a burn-in test operation, for example, are arranged in groups on the respective burn-in board 3 and can be electrically contact-connected via the first contact unit 15. Via the first contact unit 15, the integrated chips are supplied with signals and with a supply voltage to carry out the test during the burn-in operation.

The adapter element 13 provides connections for a plurality of the test modules 7 to a burn-in board 3, which is able to test all the integrated chips on a burn-in board 3 in one burn-in test operation. The adapter element 13 is necessary since a test module 7 may make available only a limited current and/or a limited number of tester channels for the testing of the integrated chips on the tester palette (or burn-in board). If the number of tester channels is insufficient or if the current driver capability of the test module 7 is too low to test all the receptacles with integrated chips in the burn-in test operation, then either only a portion of the chip receptacles 4 of the burn-in board 3 may be populated with integrated chips or new test modules 7 adapted to the integrated chips to be tested and to the number thereof on a tester palette 3 need to be constructed.

The provision of the adapter element 13 facilitates bundling conventional tester modules 7 by providing electrical lines in a suitable manner between the third and fourth contact units 12, 14 in order to make available each of the test modules 7 contact-connected to the adapter element 13 in each case to a group of integrated chips. By way of example, if three test modules 7 are connected to a tester palette 3 via the adapter element 13, then the first tester module can be used to drive a first group, the second tester module 7 a second group and the third tester module 7 a third group of integrated chips on the tester palette 3.

The provision of the adapter element 13 makes it possible, in this way, to connect a plurality of tester modules 7 to the respective integrated chips of a tester palette 3. In one embodiment, the adapter element 13 is provided within the heating chamber 5, thus enabling simple insertion into the tester device 2. The second and third contact units 11, 12 may be formed as elongated plug contacts which run generally in one plane with the test circuit 8 of the test module 7, which results in a space-saving arrangement.

In order for all the tester modules 7 to be contact-connected simultaneously, the adapter element 13 may include a holding element 16, on which the third contact units 12 are arranged generally perpendicularly. The test modules 7 may be contact-connected simultaneously by the adapter element 13 being placed onto the second contact units 11 of the corresponding test modules 7.

The first contact unit 15 may include pogo pins 15A which can be pushed into plug contacts 14A or the like of the fourth contact unit 14 such that electrical connections are produced.

In another embodiment, instead of the burn-in boards 3 on which chip receptacles 4 for integrated chips are arranged, burn-in boards may be provided for contact-connection of integrated circuits on an unsawn wafer. Such a burn-in board may include a first contact unit of structurally identical configuration to that in the preceding example. However, the integrated circuits on the wafer are contact-connected via a so-called contact card which is placed onto the wafer. The contact card is formed as a needle card comprising contact-connecting needles which are placed onto contact areas of the integrated circuits.

The provision of an adapter element 13 is particularly useful during the burn-in test operation for integrated circuits on a wafer since, on a wafer, there are generally a large number of integrated circuits which have to be tested in a joint burn-in test operation. The number of integrated chips is essentially determined by the area of the wafer and the size of the integrated circuits and generally does not depend on the capacity of a tester device 2 for testing the integrated chips in a burn-in test operation. Since the burn-in test operation has to proceed simultaneously for all the integrated circuits in order to ensure a defined pre-ageing process for all the integrated circuits of the wafer, a test circuit 8 of a test module 7 has to be provided for each of the integrated circuits upon insertion into the heating chamber 5. However, a construction of an adapted test module for essentially all the integrated circuits of a wafer in order to supply all the integrated circuits with a supply current is complicated and very costly. Therefore, the adapter element 13, according to embodiments of the present invention, provides bundling of a plurality of conventional test modules 7, which become available for the testing of the integrated circuits on the wafer.

What is claimed is:

1. A test system for testing a plurality of integrated circuits, comprising:
a tester device comprising a plurality of test modules, each of which is configured to perform a separate test on one or more of the integrated circuits;
a tester palette having a plurality of receptacles for connecting to the plurality of integrated circuits; and
an adapter element having a plurality of first connection devices for respectively connecting to the plurality of test modules and a second connection device for connecting to the tester palette, wherein at least two test modules are connected through the adapter element to one tester palette having the plurality of receptacles for connecting to the plurality of integrated circuits,
whereby a first test module of the plurality of test modules performs a first test on at least one integrated circuit of the plurality of integrated circuits, and a second test module of the plurality of test modules simultaneously performs a second test on a different one or more integrated circuits of the plurality of integrated circuits.

2. The test system of claim 1, wherein a capacity requirement for testing all of the plurality of integrated circuits in a burn-in test exceeds a capacity of a single test module, and wherein the plurality of receptacles are arranged into a plurality of groups, each group of receptacles being connected respectively to one of the plurality of test modules through the adapter element.

3. The test system of claim 2, wherein the tester palette comprises a burn-in board and the tester modules are configured to carry out a burn-in test operation for the plurality of integrated circuits respectively connected thereto simultaneously.

4. The test system of claim 3, further comprising:
a heating chamber in which the burn-in board and the adapter element are disposed; and
wherein the first connection devices are disposed to connect the plurality of test modules which are disposed outside of the heating chamber to the adapter element disposed inside the heating chamber.

5. The test system of claim 1, wherein the tester palette includes a first contact unit having one or more pogo pins and the second connection device of the adapter element includes one or more plug contacts for receiving the one or more pogo pins.

6. The test system of claim 1, further comprising:
a plurality of third connection devices disposed as one of a contact strip and a connection strip arranged in one plane respectively on the test modules.

7. The test system of claim 1, wherein the adapter element includes a holding element comprising a first side having a plurality of first contact units for connecting to the plurality of first connection devices respectively and a second side having a second contact unit for connecting to the second connection device.

8. The test system of claim 7, wherein the plurality of first connection devices and the plurality of test modules are disposed substantially perpendicularly to the holding element of the adapter element.

9. The test system of claim 1, wherein the tester palette comprises a contact card having a plurality of contact-connecting needles for contacting the plurality of integrated circuits disposed on a wafer.

10. An adapter for a test system for testing a plurality of integrated circuits, comprising:
a first plurality of contact units for connecting to a plurality of test modules, each of which is configured to perform a separate test on one or more of the integrated circuits; and
a second plurality of contact units connectable to a tester palette having a plurality of receptacles for connecting to the plurality of integrated circuits, wherein at least two test modules are connected to one tester palette through the adapter,
whereby a first test module of the plurality of test modules performs a first test on at least one integrated circuit of the plurality of integrated circuits, and a second test module of the plurality of test modules simultaneously performs a second test on a different one or more integrated circuits of the plurality of integrated circuits.

11. The adapter of claim 10, further comprising:
a holding element having the first and second plurality of contact units disposed thereon.

12. The adapter of claim 11, wherein the plurality of test modules are disposed substantially perpendicularly to the holding element of the adapter element.

13. The adapter of claim 11, wherein a capacity requirement for testing all of the plurality of integrated circuits in a burn-in test exceeds a capacity of a single test module, and wherein the plurality of receptacles are arranged into a plurality of groups, each group of receptacles being connected respectively to one of the plurality of test modules through the adapter.

14. The adapter of claim 11, wherein the second plurality of contact units include one or more plug contacts for receiving one or more pogo pins disposed on the tester palette.

15. A test system for testing a plurality of integrated circuits, comprising:
a tester means for carrying out test operations, the tester means comprising a plurality of test modules having one or more test circuits, wherein each of the plurality of test modules is configured to perform a separate test on one or more of the integrated circuits;
a palette means for connecting to the plurality of integrated circuits, the palette means having a plurality of receptacle means for contacting the integrated circuits; and
an adapter means for connecting the tester modules and the palette means, wherein at least two test modules are connected through the adapter means to one palette means having the plurality of receptacle means for connecting to the plurality of integrated circuits,
whereby a first test module of the plurality of test modules performs a first test on at least one integrated circuit of the plurality of integrated circuits, and a second test module of the plurality of test modules simultaneously performs a second test on a different one or more integrated circuits of the plurality of integrated circuits.

16. The test system of claim 15, wherein a capacity requirement for testing all of the plurality of integrated circuits in a burn-in test exceeds a capacity of a single test module, and wherein the plurality of receptacle means are arranged into a plurality of groups, each group of receptacle means being connected respectively to one of the plurality of test modules through the adapter means.

17. The test system of claim 16, further comprising:
a heating chamber in which the palette means and the adapter means are disposed; and one or more connection means disposed to connect the plurality of test modules which are disposed outside of the heating chamber to the adapter means disposed inside the heating chamber, wherein the palette means comprises a burn-in board and the tester modules are configured to carry out a burn-in test operation to one or more of the plurality of integrated circuits simultaneously.

18. The test system of claim 15, further comprising:

one or more connection means for connecting the tester means to the adapter means, wherein the adapter means includes a holding means having a plurality of contact means for connecting to the one or more connection means respectively.

19. The test system of claim 18, wherein the palette means includes a plurality of pogo pins connected to the plurality of integrated circuits and wherein the adapter means includes one or more plug contacts for receiving the one or more pogo pins disposed on the palette means.

20. The test system of claim 15, wherein the palette means comprises a contact card having a plurality of contact-connecting needles for contacting the plurality of integrated circuits disposed on a wafer.

21. An adapter for a test system for testing a plurality of integrated circuits, comprising:

a plurality of first connection devices for respectively connecting to a plurality of test modules disposed on a tester, each test module being configured to perform a separate test on one or more of the integrated circuits; and a second connection device for connecting to a tester palette having a plurality of receptacles for connecting to the plurality of integrated circuits, wherein at least two of the first connection devices are connected to one second connection device, whereby a first test module of the plurality of test modules performs a first test on at least one integrated circuit of the plurality of integrated circuits, and a second test module of the plurality of test modules simultaneously performs a second test on a different one or more integrated circuits of the plurality of integrated circuits.

* * * * *